(12) United States Patent
Kim et al.

(10) Patent No.: US 6,274,416 B1
(45) Date of Patent: *Aug. 14, 2001

(54) METHOD FOR FABRICATING A SEMICONDUCTOR DEVICE INCLUDING A LATCH-UP PREVENTING CONDUCTIVE LAYER

(75) Inventors: Dong Hoon Kim, Chungcheongbuk-do; Joong Jin Lee, Seoul, both of (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,607

(22) Filed: Feb. 2, 1999

(30) Foreign Application Priority Data

Feb. 25, 1998 (KR) .................................................. 98-5964

(51) Int. Cl.7 ................................................ H01L 21/8238
(52) U.S. Cl. ......................... 438/199; 438/222; 438/223
(58) Field of Search .................................. 438/199, 222, 438/223, 226, 227, 228, 128, 129, 153, 154; 257/274, 206, 338, 350, 351, 357, 359, 365, 377, 372, 345, 369, 340, 394

(56) References Cited

U.S. PATENT DOCUMENTS

| | | | |
|---|---|---|---|
| 5,420,061 | 5/1995 | Manning | 438/218 |
| 5,478,761 * | 12/1995 | Komori et al. | 438/228 |
| 5,668,755 | 9/1997 | Hidaka | 365/182 |
| 5,696,016 * | 12/1997 | Chen et al. | 438/199 |
| 5,831,313 * | 11/1998 | Han et al. | 257/371 |
| 5,858,826 * | 1/1999 | Lee et al. | 438/228 |

FOREIGN PATENT DOCUMENTS 59-222957A * 12/1984 (JP) .

* cited by examiner

*Primary Examiner*—Olik Chaudhuri
*Assistant Examiner*—Hoai Pham

(57) ABSTRACT

Provided with a semiconductor device which is adopted to reduce the resistance of a well without the need to increase the concentration of dopants in forming the well by depositing conductive layer patterns and then growing an epitaxial layer on the conductive layer patterns, the semiconductor device including: conductive layer patterns formed on a semiconductor substrate; a semiconductor layer formed on the semiconductor substrate and the conductive layer patterns; well regions formed in the semiconductor layer and the semiconductor substrate such that the conductive layer patterns are positioned at the bottoms of the well regions; and gate and source/drain electrodes formed on the well regions, and a method for fabricating the semiconductor device including the steps of: forming conductive layer patterns on a semiconductor substrate; forming a semiconductor layer on the semiconductor substrate including the conductive layer patterns; forming well regions in the semiconductor layer and the semiconductor substrate such that the conductive layer patterns are positioned at the bottom of the well regions; and forming gate and source/drain electrodes on the well regions.

8 Claims, 7 Drawing Sheets

METHOD FOR FABRICATING A SEMICONDUCTOR DEVICE INCLUDING A LATCH-UP PREVENTING CONDUCTIVE LAYER

BACKGROUND OF THE INVENTION

1. Field of the Invention

The present invention relates to a semiconductor device and method for fabricating the same, and more particularly, to a semiconductor device and method for fabricating the same which is adapted to prevent the latch-up of the semiconductor device.

2. Discussion of Related Art

CMOS circuits generally experience feedback which leads to a latch-up of the device and a temporary or permanent loss of the circuit functions. The latch-up resulting from such feedback and disadvantages following therefrom will be briefly described below.

FIG. 1 is a cross-sectional view of a general CMOS transistor, and FIG. 2 is an equivalent circuit diagram of the CMOS transistor shown in FIG. 1.

As illustrated in FIGS. 1 and 2, the CMOS transistor has a p-type well 11c formed in a defined region of an n-type substrate 11a. P$^+$-type impurity regions 11b, which are used as the emitter of a pnp-type transistor, are formed in the surface of the substrate 11a. Similarly, n$^+$-type impurity regions 11d used as the emitter of an npn-type transistor are formed in the surface of the substrate 11a corresponding to the p-type well 11c.

Consequently, the p$^+$-type impurity regions 11b, n-type substrate 11a and p-type well 11c form a pnp-type positive transistor in the horizontal direction, while the n$^+$-type impurity regions 11d, p-type well 11c and n-type substrate 11a form a npn-type positive transistor vertically. The bases of those two transistors provide positive feedback paths which are respectively driven by the collectors of different transistors.

Actually, a parasitic pnpn-junction is formed by the p- and n-junctions in providing both of the pnp- and npn-type transistors. Such a pnpn-junction is an unexpected result in the CMOS transistor and causes a deterioration in the characteristics of the device. That is, the pnpn-junction gives rise to a latch-up affecting the operation of the CMOS transistor.

As shown in FIGS. 1 and 2, a resistance $R_w$ is induced by series resistances in the p-type well 11c with respect to the current flowing into the p$^+$-type impurity regions 11b. Reference symbol $R_S$ indicates the resistance value of the substrate with respect to the n$^+$-type impurity regions 11d. The current flowing across the resistance $R_S$ can be calculated from the resistance value $R_S$. The resistance value $R_S$ of the substrate may be obtained, but that of the p-type well 11c is hard to calculate due to non-uniform dopants and thickness of the depletion layer.

As described previously, the parasitic pnpn-junction has an influence upon the operation of the CMOS transistor and may be prevented by increasing the space between the devices. However, with increases in device integration, the space between the devices is reduced and the pnpn-junction is inevitable.

A method for fabricating a semiconductor device in accordance with prior art will be described in connection with FIGS. 3a–3e, which are cross-sectional views of the conventional semiconductor device at different stages during the fabrication process conventionally employed.

As shown in FIG. 3a, a silicon oxide layer 32 is formed via an oxidation of the surface of an n-type semiconductor substrate 31.

As shown in FIG. 3b, the silicon oxide layer 32 is eliminated in the region in which an n-channel transistor will be formed. A p-type impurity is then doped and diffused so as to form a p-type well region 33.

As shown in FIG. 3c, the silicon oxide layer 32 is selectively eliminated in the region in which the source and drain of a p-channel transistor will be formed on the surface of the n-type substrate 31. A p-type impurity is highly doped to form p$^+$-type impurity regions 34.

As shown in FIG. 3d, the silicon oxide layer 32 is selectively eliminated in order to form the source and drain of the n-channel transistor in the p-type well region 33. An n-type impurity is then doped and diffused, forming n$^+$-type impurity regions 35.

As shown in FIG. 3e, there are formed gate electrodes 36 and 36a of the n- and p-channel transistors, respectively, so that the semiconductor device of the prior art is completed.

Such a conventional fabrication of a semiconductor device however involves a disadvantage in that the resistance of the well $R_W$ cannot be reduced below a particular sheet resistance specified by the characteristics of the device in applying a substrate bias through the contact or the like after the completion of the fabrication.

SUMMARY OF THE INVENTION

The present invention is directed to a semiconductor device and method for fabricating the same that substantially obviates one or more of the above or other problems due to limitations and disadvantages of the related art.

An object of the present invention is to provide a semiconductor device and method for fabricating the same which is adapted to prevent a latch-up, thereby enhancing the reliability of the device by forming a buried layer comprising conductive layer patterns on the surface of a wafer.

Additional features and advantages of the invention will be set forth in the description which follows, and in part will be apparent from the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device includes: conductive layer patterns formed on a semiconductor substrate; a semiconductor layer formed on the semiconductor substrate and the conductive layer patterns; well regions formed in the semiconductor layer and the semiconductor substrate such that the conductive layer patterns are positioned at the bottoms of the well regions; and gate and source/drain electrodes formed on the well regions.

In another aspect of the present invention, a method for fabricating a semiconductor device includes the steps of: forming conductive layer patterns on a semiconductor substrate, forming a semiconductor layer on the semiconductor substrate including the conductive layer patterns; forming well regions in the semiconductor layer and the semiconductor substrate such that the conductive layer patterns are positioned at the bottoms of the well regions; and forming gate and source/drain electrodes on the well regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
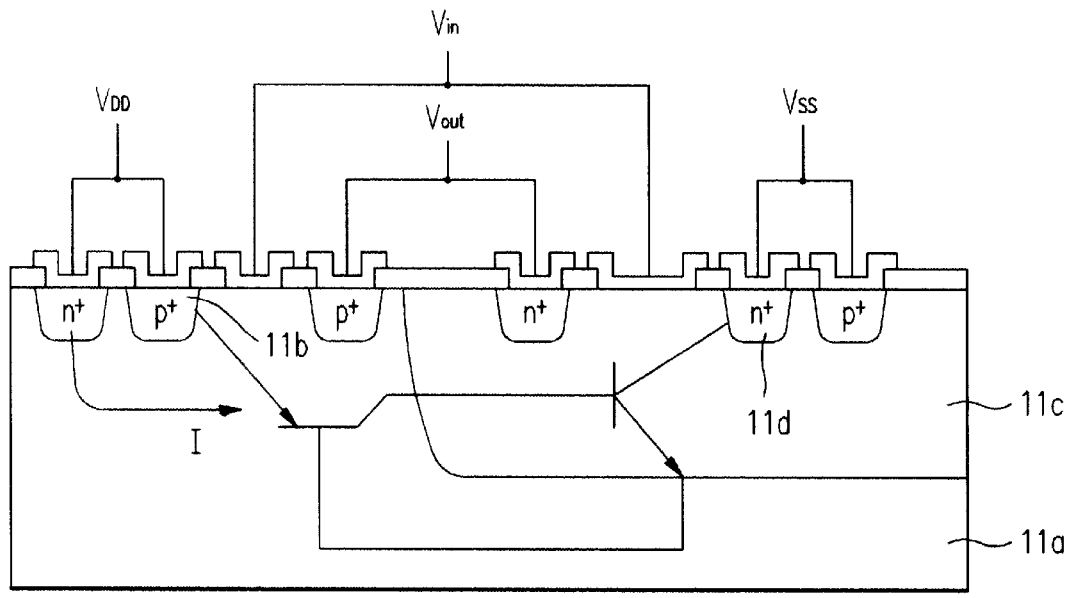
FIG. 1 is a cross-sectional view of a general CMOS transistor.
Figure 2:
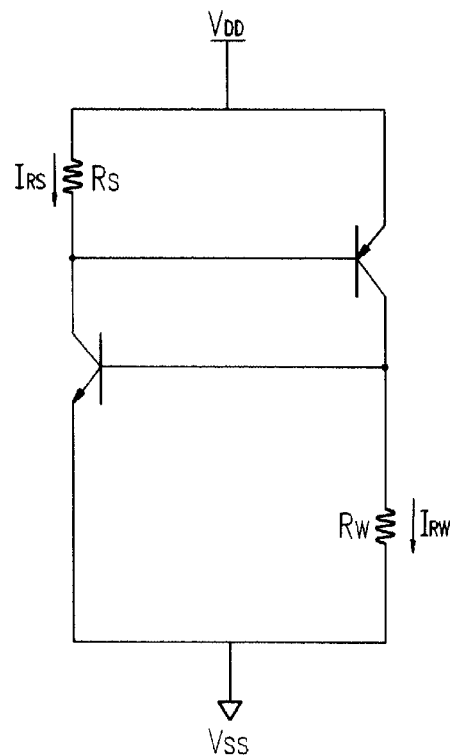
FIG. 2 is an equivalent circuit diagram of the CMOS transistor shown in FIG. 1.
Figure 3A:
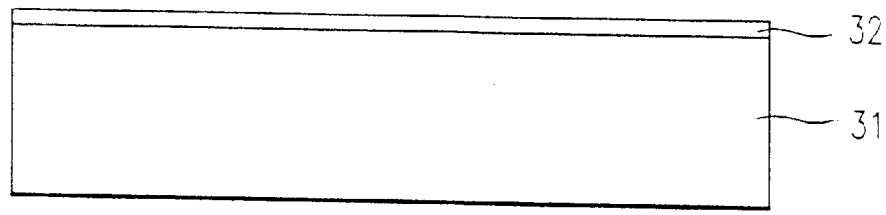
FIGS. 3a–3e are cross-sectional views illustrating a method for fabricating a semiconductor device according to prior art.
Figure 3B:
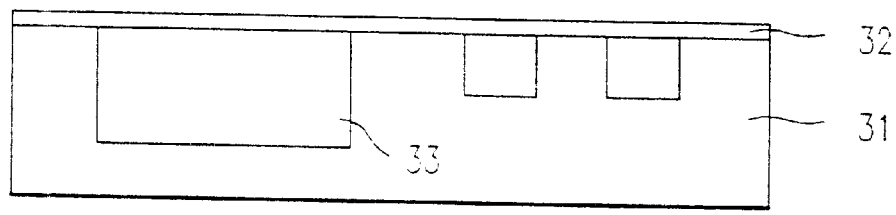
Figure 3C:
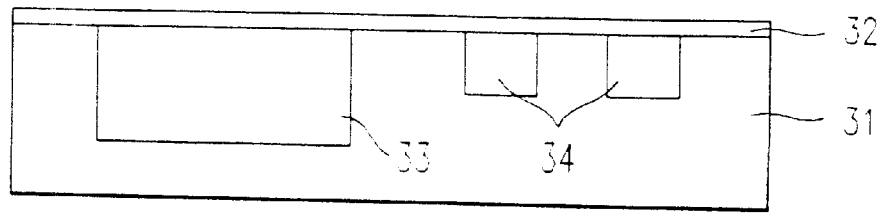
Figure 3D:
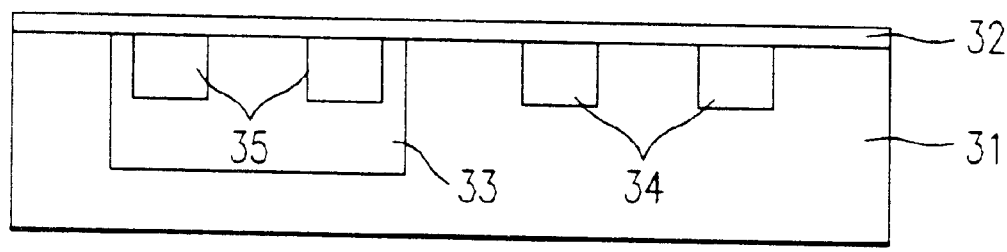
Figure 3E:
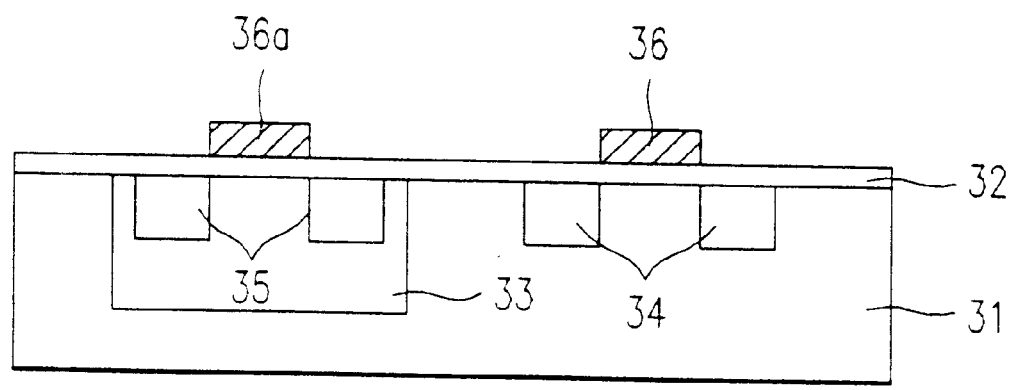
Figure 4:
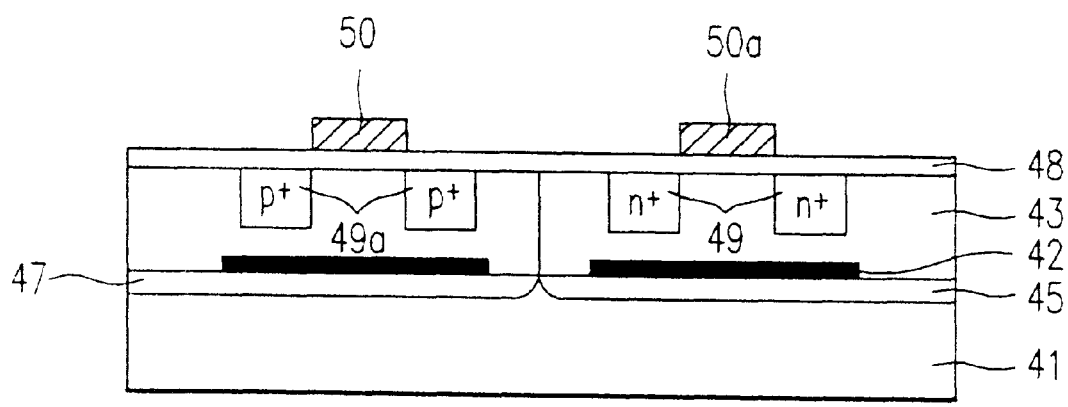
FIG. 4 is a cross-sectional view of a semiconductor device in accordance with the present invention.

FIG. 4 is a cross-section of a semiconductor device in accordance with the present invention.

As shown in FIG. 4, the semiconductor device includes conductive layer patterns 42 formed on a semiconductor substrate 41; a semiconductor layer 43 formed on the substrate 41 and conductive layer patterns 42; well regions 45 and 47 formed in the semiconductor layer 43 and substrate 41 such that the conductive layer patterns 42 are positioned at the top of the well regions 45 and 47; gate electrodes 50a and 50 formed on the well regions 45 and 47; and source and drain regions 49 and 49a.

The conductive layer patterns 42 consist of a metal or a metal compound, and the semiconductor layer 43 is an epitaxial layer grown from the substrate 41, which acts as a seed layer in the growth.

A method for fabricating such a semiconductor device will be described below with reference to the attached drawings.

FIGS. 5a–5f are cross-sectional views illustrating a method for fabricating a semiconductor device according to the present invention.

Figure 5A:
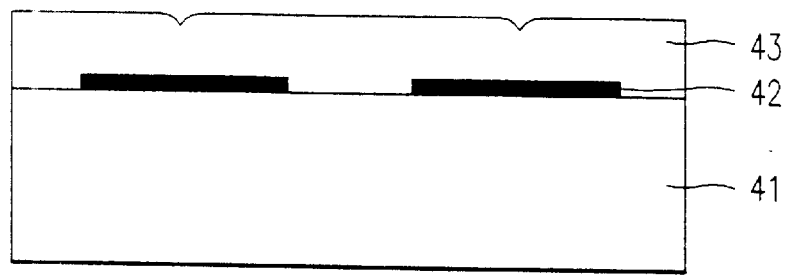
FIGS. 5a–5f are cross-sectional views illustrating a method for fabricating a semiconductor device according to the present invention.

As shown in FIG. 5a, conductive layer patterns 42 are formed on a semiconductor substrate 41.

The conductive layer patterns 42 are made from a metal or a metal compound having a melting point greater than 1200° C. selected from the group consisting of tungsten W, titanium Ti, molybdenum Mo, platinum Pt, tantalum Ta, tungsten/titanium W/Ti, tungsten silicide $WSi_x$, and titanium nitride TiN.

In forming the conductive layer patterns 42, as exemplified in the embodiment of the present invention, a metal is deposited on the semiconductor substrate 41 and then patterned. Instead of forming the conductive layer patterns 42 collectively across the whole surface of the semiconductor substrate 41, well regions are defined and then the conductive layer patterns 42 are formed separately in the well regions.

Alternatively, it is possible to form the conductive layer patterns 42 selectively in specified well regions according to the type of the device.

Figure 6A:
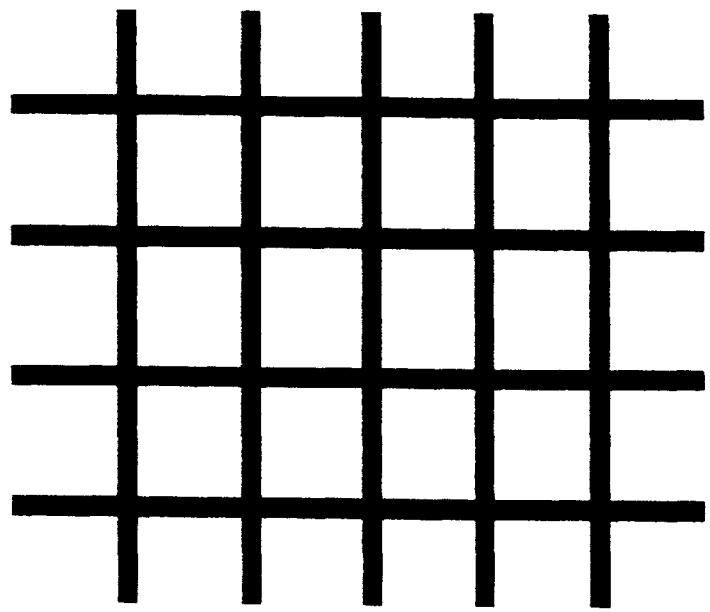
FIGS. 6a–6b are views illustrating a conductive layer pattern in accordance with the present invention.
Figure 6B:
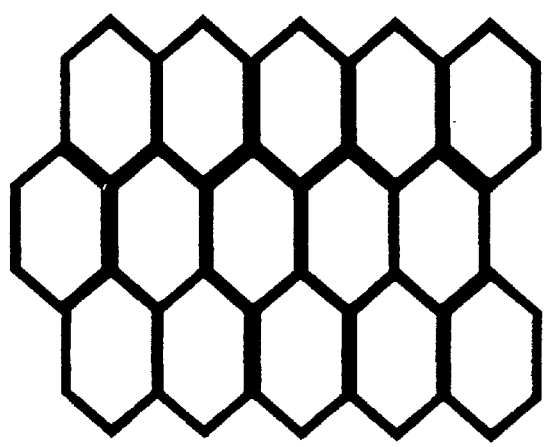

FIGS. 6a–6b are views illustrating a conductive layer pattern that takes the form of a matrix or a honeycomb. The conductive layer pattern may also take the form of a net or any other shape having at least one hole therein.

When the conductive layer pattern 42 is not given in the flat panel form, but is instead formed as a matrix or a honeycomb or a net, it is possible to make the subsequent growth of an epitaxial layer easier and minimize the resistance per unit area.

Following the formation of conductive layer patterns 42 on the semiconductor substrate 41, a semiconductor layer 43 is formed on the whole surface including the conductive layer patterns 42.

The semiconductor layer 43 is an epitaxial layer grown from the substrate 41 which acts as a seed layer.

The epitaxial layer is grown in the horizontal and vertical directions simultaneously enough to cover the conductive layer patterns 42.

Figure 5B:
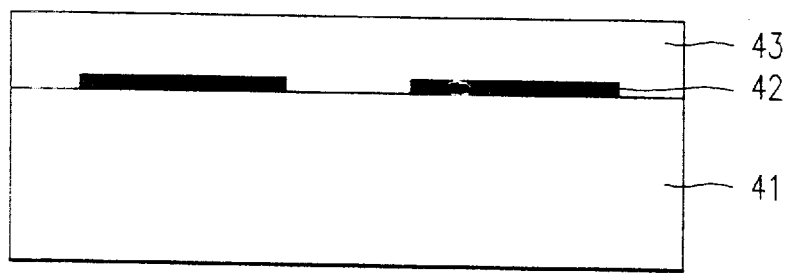

As shown in FIGS. 5b, a CMP (Chemical Mechanical Polishing) process is conducted to planarize the surface of the semiconductor layer 43.

Figure 5C:
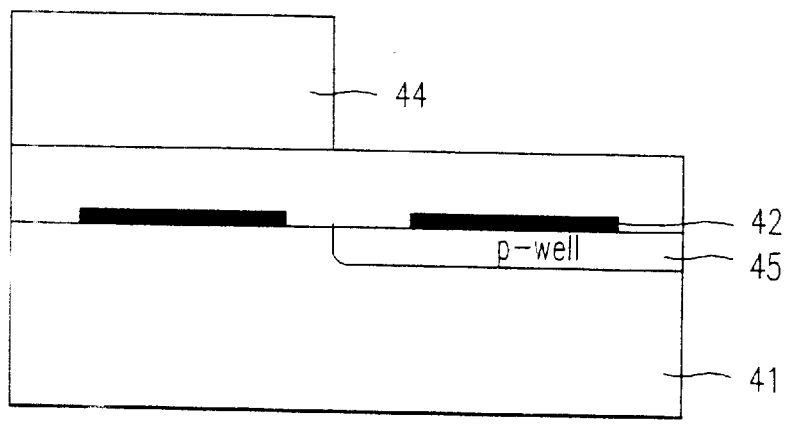

As shown in FIG. 5c, a first photo resist 44 is deposited on the semiconductor layer 43 and patterned through an exposure and a development, exposing a defined portion of the semiconductor layer 43.

Using the first photo resist 44 as a mask, a p-type impurity is implanted to form a p-type well 45 in the semiconductor layer 43 and substrate 41.

At this stage, the depth of the well 45 is controlled such that the conductive layer patterns 42 are positioned at the top of the well 45.

Figure 5D:
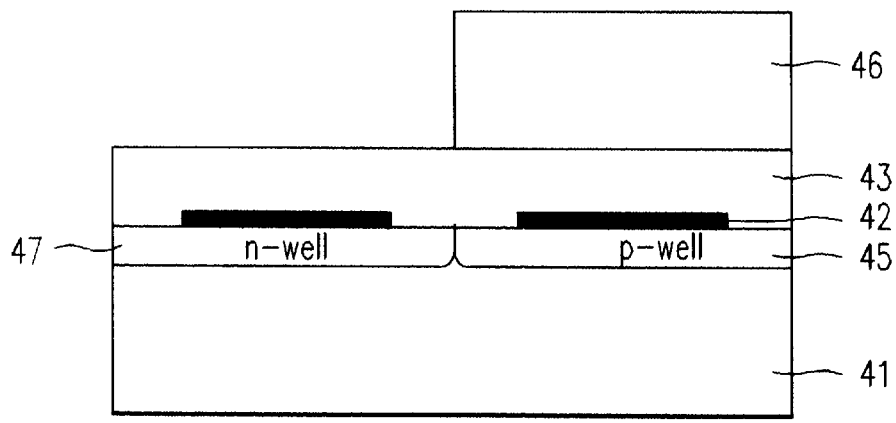

As shown in FIG. 5d, after the first photo resist 44 is eliminated, a second photo resist 46 is deposited on the semiconductor layer 43 and patterned through an exposure and a development. Using the second photo resist 46 patterned as a mask, an n-type impurity is implanted to form an n-type well 47 in the semiconductor layer 43 and substrate 41.

At this stage, the depth of the well 47 is regulated such that the conductive layer patterns 42 are positioned at the top of the well 47.

The device is fabricated after a separate formation of p-type and n-type wells 45 and 47 on the wafer 41, as described above.

Figure 5E:
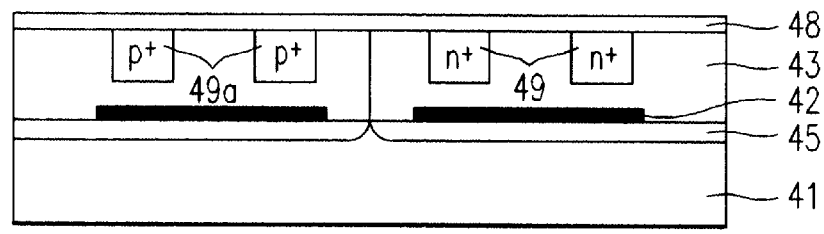

That is, as shown in FIG. 5e, the second photo resist 46 is eliminated, and an insulating layer 48 is deposited on the whole surface of the substrate 41.

The p-type well 45 is exclusively highly doped with n-type impurity by means of a mask (not shown), forming source and drain regions 49 of a p-channel transistor.

Further, the n-type well 47 is exclusively highly doped with p-type impurity by means of a mask (not shown), forming source and drain regions 49a of an n-channel transistor.

Figure 5F:
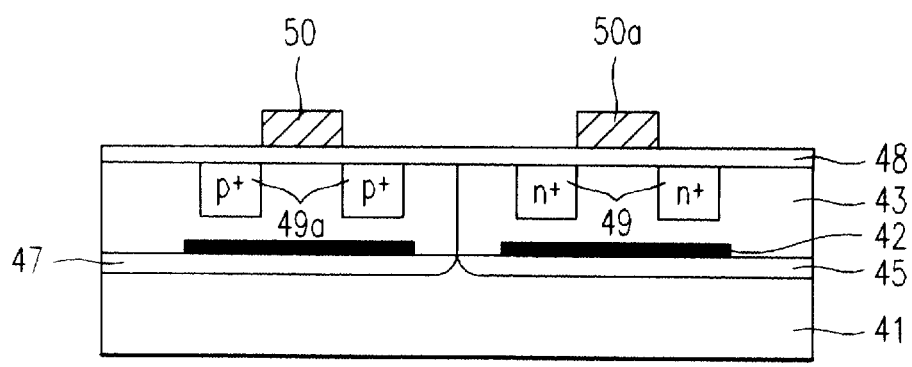

As shown in FIG. 5f, there are formed gate electrodes 50 and 50a of the n- and p-channel transistors, respectively, so that the semiconductor device of the present invention is finally completed.

Such a semiconductor device and method for fabricating the same according to the present invention has many advantages over the prior art. For instance, while a parasitic pnpn-junction formed in a general CMOS device usually causes the resistance of the well and the gain of the device current to increase, the resistance of the well can be reduced by forming low-resistance conductive layer patterns (e.g., 42 or 47) within the well instead of performing a separate process for regulating the bias of the well. In this manner, the resistance of the well can be reduced to the resistance of the low-resistance conductive layer pattern, thereby preventing the latch-up with a consequence of enhancing the reliability of the device.

It will be apparent to those skilled in the art that various modifications and variations can be made in the semiconductor device and method for fabricating the same according to the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising:

forming conductive layer patterns on a semiconductor substrate which involves patterning the conductive layer patterns in the form of at least one of a matrix, a honeycomb and a net;

forming a semiconductor layer on the semiconductor substrate including the conductive layer patterns;

forming source/drain electrodes within a surface position of the semiconductor layer;

forming well regions in the semiconductor layer and the semiconductor substrate such that the conductive layer patterns are positioned at the top of the well regions; and forming a gate electrode above the semiconductor layer and the well regions and between the source/drain electrodes.

2. The method as defined in claim 1, wherein the semiconductor layer is an epitaxial layer grown from the substrate functioning as a seed.

3. The method as defined in claim 2, wherein the epitaxial layer is grown enough to cover the conductive layer patterns through an epitaxial growth in the horizontal and vertical directions.

4. The method as defined in claim 1, wherein forming the well regions comprises:

depositing and patterning a first photo resist on the semiconductor layer;

implanting a p-type impurity to form a p-type well by using the first photo resist pattern as a mask, and eliminating the first photo resist;

depositing and patterning a second photo resist on the semiconductor layer including the p-type; and implanting an n-type impurity to form an n-type well by using the second photo resist pattern as a mask.

5. The method as defined in claim 4, further comprising:

forming an insulating layer on the whole surface of the substrate including the p-type and n-type wells, wherein forming the source/drain electrodes comprises:

selectively implanting the p-type impurity in the n-type well to form the source/drain electrodes for an n-channel transistor; and selectively implanting the n-type impurity in the p-type well to form the source/drain electrodes for a p-channel transistor.

6. The method as defined in claim 5, wherein forming the source/drain electrodes for the n-channel and p-channel transistors further comprises:

masking the p-type well in order to form the source/drain electrodes of the n-channel transistor; and masking the n-type well in order to form the source/drain electrodes of the p-channel transistor.

7. The method as defined in claim 1, wherein the conductive layer patterns are formed across the whole surface of the semiconductor substrate, or selectively formed only in specified well regions.

8. The method as defined in claim 1, wherein the conductive layer patterns are metallic.

* * * * *